(12) United States Patent
Reed et al.

(10) Patent No.: US 6,394,398 B1
(45) Date of Patent: May 28, 2002

(54) MODULAR INTER-CABINET HORIZONTAL CABLE SUPPORT APPARATUS

(75) Inventors: Stephen S. Reed, Georgetown; William McMillan, III, Austin, both of TX (US)

(73) Assignee: Chatsworth Products, Inc., Westlake Village, CA (US)

(*) Notice: Subject to any disclaimer, the term of this patent is extended or adjusted under 35 U.S.C. 154(b) by 0 days.

(21) Appl. No.: 09/599,114

(22) Filed: Jun. 22, 2000

(51) Int. Cl.[7] .................................................. F16L 5/00
(52) U.S. Cl. ........................ 248/57; 248/250; 248/235; 211/153
(58) Field of Search ........................ 248/57, 245, 247, 248/250, 235, 239, 241; 211/135, 134, 153, 187; 312/265.5, 265.3, 108, 263, 257.1

(56) References Cited

U.S. PATENT DOCUMENTS

| | | | | |
|---|---|---|---|---|
| 2,034,669 A | * | 3/1936 | Slagle ........................ | 312/156 |
| 2,424,217 A | * | 7/1947 | Bales ......................... | 312/141 |
| 5,009,383 A | * | 4/1991 | Chapman .................... | 248/343 |
| 5,617,797 A | * | 4/1997 | Casey ......................... | 108/42 |
| 5,997,117 A | * | 12/1999 | Krietzman ............... | 312/265.4 |
| 6,105,798 A | * | 8/2000 | Gruber et al. .............. | 211/151 |
| 6,135,299 A | * | 10/2000 | Burgess ...................... | 211/194 |
| 6,135,583 A | * | 10/2000 | Simon et al. ............ | 312/257.1 |
| 6,164,582 A | * | 12/2000 | Vara .......................... | 242/395 |
| 6,185,098 B1 | * | 2/2001 | Benavides .................. | 361/695 |

* cited by examiner

Primary Examiner—Leslie A. Braun
Assistant Examiner—A. Joseph Wujciak
(74) Attorney, Agent, or Firm—Kennedy Covington Lobdell & Hickman, LLP

(57) ABSTRACT

A cable support apparatus for supporting cables in an equipment support system having a frame apparatus includes a shelf member having a top surface for supporting cables, and at least one mounting bracket extending from each end of the shelf member for mounting the cable support apparatus to the frame apparatus.

27 Claims, 3 Drawing Sheets

MODULAR INTER-CABINET HORIZONTAL CABLE SUPPORT APPARATUS

FIELD OF THE PRESENT INVENTION

The present invention relates generally to a cable support apparatus and, more particularly, to a cable support apparatus disposed entirely within a frame apparatus for receiving and supporting cable extended from an adjacent frame apparatus.

BACKGROUND OF THE PRESENT INVENTION

Racks for supporting a wide variety of objects have been well known for decades. More recently, the advent of technological advances in audio and video equipment and in computer equipment has effected corresponding advances in the structures used to support and retain such electrical components. For example, as the size of such components has dropped, the number of components supported on a particular rack has increased, resulting in a greater number of external connections. In addition, the demand for inter-connectivity between systems, and particularly the demand for server equipment utilized to provide this interconnectivity, has increased the amount of physical connections that must be made between the equipment stored on one rack and that stored in other racks, either adjacently or remotely. As a result, in addition to being able to store equipment itself, each rack must also be able to support and manage tremendous amounts of cables and wires which are connected to or routed through that rack.

With regard to horizontal or lateral runs of cables, the most common systems traditionally employed to support cables have been overhead cabling systems and under-floor cabling systems. Overhead cabling systems typically employ exposed overhead raceway structures to route cables to and from the tops of the various racks in an installation. Under-floor cabling systems are typically installed underneath raised floors in the installation area. Though both are effective in many applications, they each suffer from a number of drawbacks. For example, the negative aesthetic effect of the exposed nature of overhead raceways may not be acceptable in a particular installation. Moreover, in some installation locations there may not be adequate ceiling clearance for overhead raceway to be installed. Under-floor systems may address the aesthetic issues, but are likely not always feasible because of space requirements or in pre-existing installations. Each type of system also entails a significant expense to both purchase and install the raceway system or raised floor, respectively.

When racks are positioned adjacent to each other in a particular installation, one solution to the aforementioned problems has been to extend a standard section of ladder raceway directly through adjacent racks. Cables may then be supported by the raceway and routed to appropriate locations within each rack, and the internal nature of the raceways addresses the aesthetic issues. However, such a system also suffers from many drawbacks. For example, standard ladder raceways come in standard lengths which do not correspond to the great number of size permutations resulting from different-sized racks and combinations of racks. Although ladder raceways could be precut to particular lengths, there is no standard for the external dimensions of racks, and thus the number of different lengths that could be required is prohibitive. Finally, the placement of the cross-members of the ladder raceways may interfere with routing a cable in a particular location by blocking a particular path, by failing to provide support for a cable in a particular location and thus allowing the cable to dangle, or by interfering with the bending of a cable to meet certain minimum radius requirements which thus prevents conformance to standards on cable radius bends and therefore creates a risk of reduced transmission speeds. Thus, a need exists for an aesthetically-acceptable cable support apparatus for conveniently supporting cables which extend between adjacent racks without requiring custom manufacture or installation and which does not interfere with the routing of the cables within the interiors of the racks.

SUMMARY OF THE PRESENT INVENTION

Briefly summarized, the present invention includes a cable support apparatus for supporting cable in an equipment support system having a frame apparatus, the cable support apparatus including a shelf member having distal ends, first and second opposing sides, a generally planar top surface for supporting a cable, a bottom surface and a plurality of ventilation openings extending vertically through the top and bottom surfaces; at least one mounting bracket extending orthogonally from each distal end of the shelf member for mounting the cable support apparatus to the frame apparatus; a retention flange extending generally vertically from the top surface of the shelf member longitudinally along the first side of the shelf member for retaining cables on the top surface of the shelf member; and a support rail extending generally vertically from the bottom surface of the shelf member longitudinally along the second side of the shelf member for structurally reinforcing the shelf member.

In features of this apparatus, the apparatus includes a bend member extending away from at least one distal end of the planar shelf member; and the apparatus includes at least one spool extending generally vertically from the top surface of the shelf member.

The present invention also includes a cable support apparatus for supporting cables in an equipment support system including a planar shelf member having distal ends, a top surface for supporting a cable and a bottom surface; at least one mounting bracket extending orthogonally from each distal end of the shelf member for mounting the cable support apparatus to the frame apparatus, wherein each mounting bracket has an upper edge; and a bend member extending over the upper edge of one of the mounting brackets at one distal end of the shelf member, wherein the bend member intersects the top surface of the shelf member along a line of intersection disposed substantially inward from the distal end of the shelf member, wherein the bend member is upwardly tapered from the line of intersection to a line of apogee disposed above the top surface of the shelf member and inward from the distal end of the shelf member, and wherein the bend member is generally downwardly curved from the line of apogee over the upper edge of the mounting bracket to a line of verticality, the line of verticality being defined as the line at which the slope of the bend member is substantially vertical.

In features of this apparatus: the mounting brackets extend orthogonally downward from the bottom surface of the shelf member; the curvature of the bend member is substantially uniform from the line of apogee to the line of verticality; a radius is defined at each point along the bend member by the curvature of the bend member at each respective point, and wherein each such defined radius of curvature is at least as great as a predefined minimum radius of curvature; the predefined minimum radius of curvature corresponds to a minimum radius of cable curvature required to ensure reliable operation of the cable; and the apparatus includes at least one spool extending generally vertically from the top surface of the shelf member.

The present invention also includes an equipment support system including a frame apparatus having a plurality of horizontal frame members and a plurality of vertical frame members, each of which has interior and exterior surfaces, and wherein the external surfaces collectively define a frame periphery; two horizontal mounting rails connected to the vertical frame members of the frame apparatus; a cable support apparatus including a shelf member and two mounting brackets extending downwardly from distal ends of the shelf member, wherein the mounting brackets are mounted to respective horizontal mounting rails, wherein the cable support apparatus has two distal edges, and wherein the cable support apparatus is disposed wholly within the frame periphery; and at least one vertical cable channel, defined as the vertical space formed between one of the distal edges of the cable support apparatus and the interior surfaces of the vertical frame members, for routing cables vertically within the periphery of the frame.

In features of this system: the shelf is horizontally adjustable along the horizontal mounting rails; each horizontal mounting rail includes a T-groove, each mounting bracket includes a pair of forked ends, and a respective fastener may be inserted through each forked end and into the T-groove in a horizontal mounting rail; the cable support apparatus further includes a curvilinear bend member extending downward over one of the mounting brackets; and the system includes at least one cable lying longitudinally along the cable support apparatus and extending laterally from the frame periphery at a point generally adjacent to a distal edge of the cable support apparatus.

The present invention also includes a multi-frame equipment support system including: a first frame apparatus having a plurality of horizontal frame members and a plurality of vertical frame members, each of which has interior and exterior surfaces, and wherein the external surfaces of the frame members collectively define a first frame periphery; a second frame apparatus disposed substantially adjacent to the first frame apparatus, the second frame apparatus including a plurality of horizontal frame members and a plurality of vertical frame members, each of which has interior and exterior surfaces, and wherein the external surfaces of the frame members collectively define a second frame periphery; a first elongated cable support apparatus having first and second distal ends mounted entirely within the first frame periphery at right angles to the vertical frame members of the first frame apparatus at a first predetermined height, wherein the first elongated cable support apparatus extends toward the second frame apparatus and wherein the second distal end is disposed generally adjacent to the second frame apparatus; and a second elongated cable support apparatus having first and second distal ends mounted entirely within the second frame periphery at right angles to the vertical frame members of the second frame apparatus at a second predetermined height, wherein the second predetermined height is substantially the same as the first predetermined height, wherein the second elongated cable support apparatus extends toward the first frame apparatus and wherein the first distal end of the second elongated cable support apparatus is disposed generally adjacent to the first frame apparatus and is aligned with the second distal end of the first elongated cable support apparatus.

In features of this system, the system includes a first pair of horizontal mounting rails connected to the vertical frame members of the first frame apparatus wherein the first elongated cable support apparatus is mounted to the first horizontal mounting rails; the first elongated cable support apparatus includes a first shelf member and two mounting brackets extending orthogonally from ends of the first shelf member and the mounting brackets are mounted to respective first horizontal mounting rails; the system includes at least one vertical cable channel, defined as the vertical space formed between one of the distal ends of the first elongated cable support apparatus and the interior surfaces of the vertical frame members of the first frame apparatus, for routing cables vertically within the first frame periphery; the vertical cable channel is formed between the second distal end of the first elongated cable support apparatus and the interior surfaces of the vertical frame members proximate to the second frame apparatus; and the system includes a second vertical cable channel, defined as the vertical space formed between the first distal end of the second elongated cable support apparatus and the interior surfaces of the vertical frame members of the second frame apparatus, for routing cables vertically within the second frame periphery.

The present invention also includes a method for supporting a cable, having at least a first cable segment and a second cable segment, in an equipment support system having a frame apparatus which defines a frame interior, including the steps of: mounting a cable support apparatus having opposite ends wholly within the interior of the frame at a first predetermined height; supporting the first cable segment outside the periphery of the frame at a second predetermined height which is substantially equal to the first predetermined height; directing the cable from outside the interior of the frame at the second predetermined height into the interior of the frame; and supporting the second cable segment on the cable support apparatus.

In a feature of this method, the method includes mounting a pair of horizontal mounting rails to the frame apparatus, wherein the step of mounting the cable support apparatus includes mounting the cable support apparatus to the horizontal mounting rails.

BRIEF DESCRIPTION OF THE DRAWINGS

Further features, embodiments, and advantages of the present invention will become apparent from the following detailed description with reference to the drawings, wherein.

DETAILED DESCRIPTION OF THE PREFERRED EMBODIMENTS

Before describing the details of the present invention, it will be appreciated that directional terms such as "right," "left," "top," "bottom," "front" and "rear" are used herein to aid in the understanding of the present invention by describing relative directions and locations, and their use herein and in the claims hereof is not intended in any way to be limiting.

Figure 1:
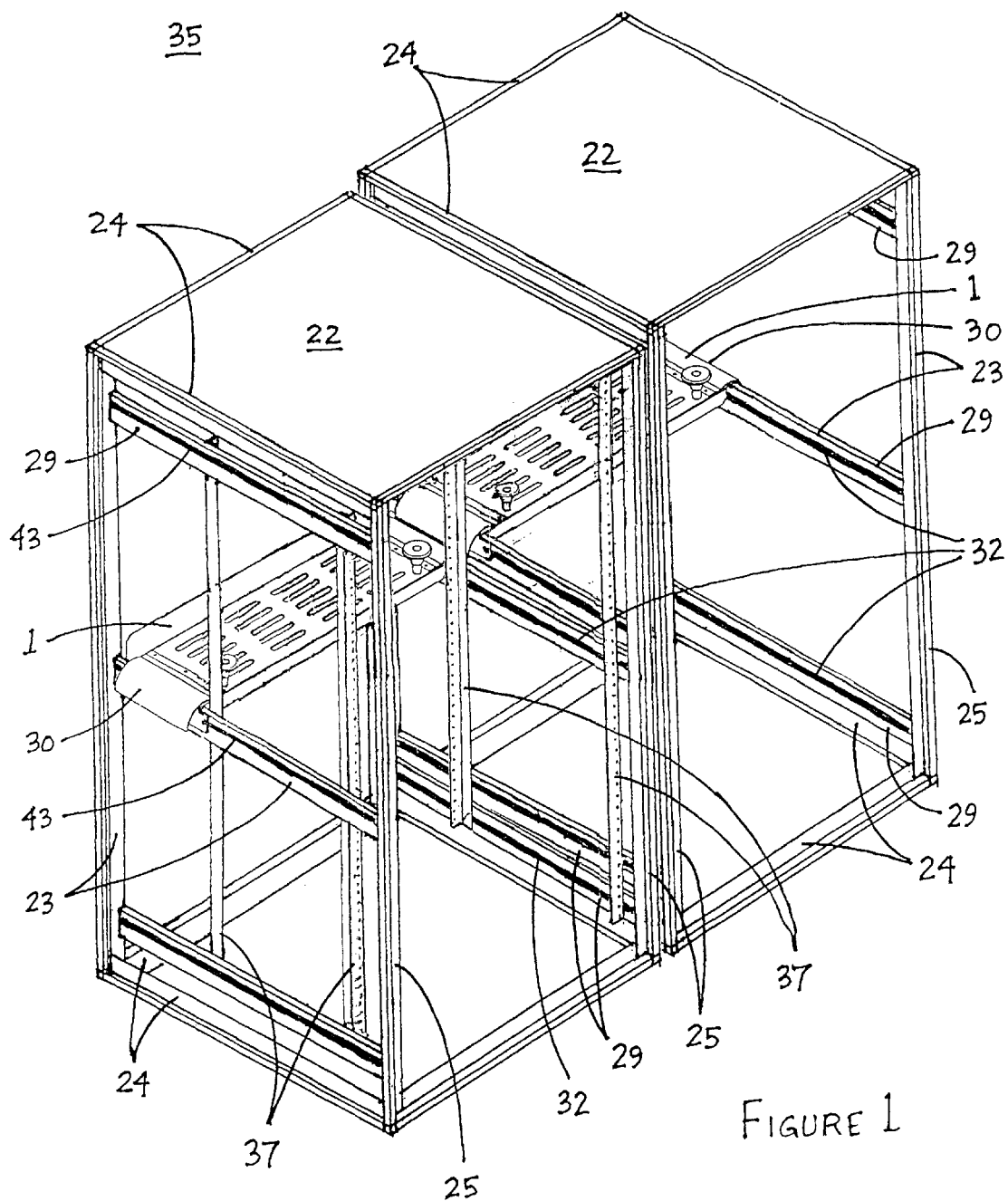
FIG. 1 is a perspective view of a multi-frame equipment support system utilizing a plurality of cable support apparatuses in accordance with the present invention.

Referring now to the drawings, in which like numerals represent like components throughout the several views, a multi-frame equipment support system 35, in accordance with the preferred embodiments of the present invention, is shown in FIG. 1. As shown and described, the multi-frame equipment support system 35 comprises at least two individual equipment support systems 22 positioned next to each other. Each equipment support system 22 includes a frame apparatus 23, including an external frame apparatus and an internal frame apparatus, and a modular cable support apparatus 1. The external frame apparatus includes four vertical frame members 25 and eight horizontal frame members 24. Each pair of adjacent vertical members 25 is connected together at their upper and lower ends by a pair of horizontal members 24 by inserting fasteners through corresponding apertures in the ends of the horizontal and vertical members 24,25. Preferably, the precision and the stability of each of the corners of the external frame apparatus is enhanced by utilizing a self-squaring corner attachment bracket such as that disclosed by the commonly-assigned U.S. Pat. No. 5,997,117 entitled "RACK FRAME CABINET," the entirety of which is hereby incorporated by reference.

Each horizontal and vertical frame member 24,25 has both interior and exterior surfaces. Together, the frame members 24,25 define a frame having a front, a rear, a top, a bottom and two sides, and the exterior surfaces of the frame members 24,25 define the periphery of the frame, which surrounds the frame interior. Although not illustrated herein, some systems may utilize a panel, including a door panel, of ordinary design and structure, to cover one or more of the front, rear, top, bottom and sides, and openings may be provided in one or more of the panels to enable cables to be directed in and out of the interior of the frame.

The internal frame apparatus includes a plurality of horizontal mounting rails 29 and may include a plurality of vertical mounting rails 37. In the embodiment shown, vertical mounting rails 37 on one side of each equipment support system 22 are connected together by three horizontal mounting rails 29, and vertical mounting rails 37 on the opposite side are connected together by three additional horizontal mounting rails 29, by inserting fasteners through apertures in the vertical mounting rails 37 and corresponding threaded openings in the ends of the horizontal mounting rails 29. The inboard side of each horizontal mounting rail 29 includes a longitudinal grooved recess 32 having a T-shaped cross-section, best illustrated in FIG. 4. Fasteners 44, such as threaded bolts, may be inserted into the T-groove 32 of each horizontal mounting rail 29 such that the heads of the bolts reside in the T-groove 32 and the threaded ends protrude from the inboard side of the horizontal mounting rail 29. Once inserted, each fastener 44 may be adjusted longitudinally to a desired location along the length of the rail 29. The three horizontal mounting rails 29 on each side of each equipment support system 22 may be connected together by inserting the fasteners 44 in the T-groove 32 through a corresponding aperture in the respective vertical mounting rail 37. The lateral position of the vertical mounting rails 37 relative to the external frame apparatus may be adjusted by longitudinally sliding the fasteners 44, and hence the ends of the vertical mounting rails 37, along the T-grooves 32. Each of the fasteners 44 may then be secured by a hexagonal nut and washer combination. Each vertical mounting rail 37 includes a series of evenly-spaced, threaded mounting apertures, extending along substantially the entire length of the rail, for use in mounting electronic components, peripheral devices, cable brackets, additional mounting members, or the like.

Figure 2:
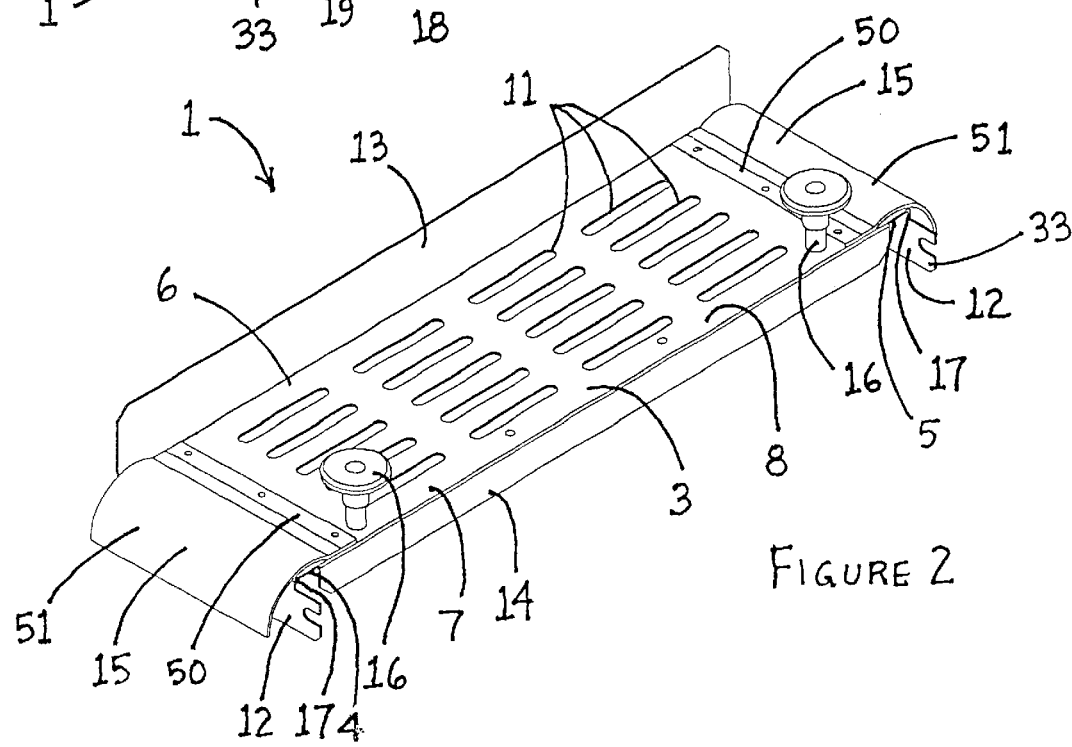
FIG. 2 is a perspective view of one of the cable support apparatuses of FIG. 1.

As best shown in FIG. 2, each cable support apparatus 1 includes a shelf member 3, a pair of mounting brackets 12, a retention flange 13, a support rail 14, a pair of bend members 15, a pair of cable distribution spools 16 and a plurality of ventilation openings 11. The generally planar shelf member 3, which is formed from a sheet of metal of a thickness sufficient to bear the weight of a large number of cables 9, has a pair of distal ends 4,5, a first side 6, a second side 7, a top surface 8 and a bottom surface 10. An integrally-formed mounting bracket 12 extends orthogonally downward from each end 4,5 of the shelf member 3. Each mounting bracket 12 has an upper edge 17 and a pair of forked ends 33. The integrally-formed retention flange 13 is longitudinally disposed along, and extends orthogonally upward from, the first side 6 of the shelf member 3 and provides structural reinforcement to the shelf member 3 to minimize span deflection of the shelf member 3 during heavy loading. The integrally-formed support rail 14 is longitudinally disposed along, and extends orthogonally downward from, the second side 7 of the shelf member 3 and provides additional structural strength to the shelf member 3. The cable distribution spools 16 are disposed along the second side 7 of the shelf member 3 and extend orthogonally upward from the top surface 8. As shown, one spool 16 is disposed near each end 4,5 of the shelf member 3, but it should be clear that the spools may be positioned elsewhere along the second side 7 of the shelf member 3 and that additional spools 16 may be utilized to provide further cable distribution flexibility.

Figure 3A:
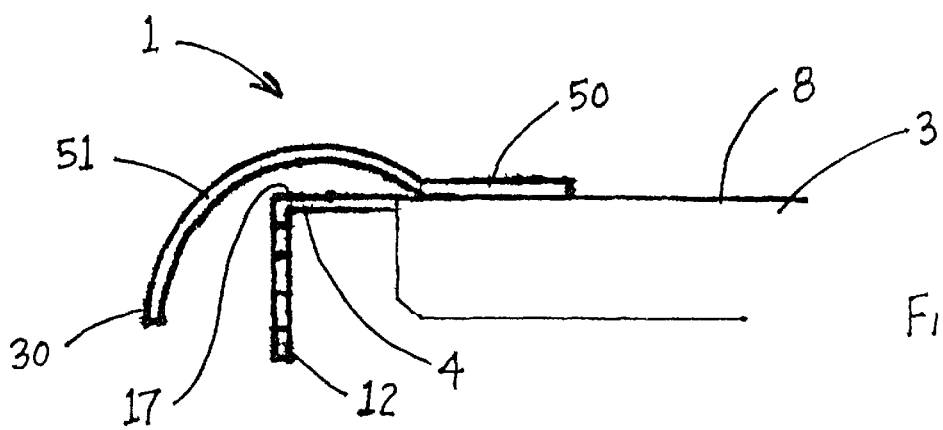
FIG. 3A is a front view of a portion of the cable support apparatus of FIG. 1.
Figure 3B:
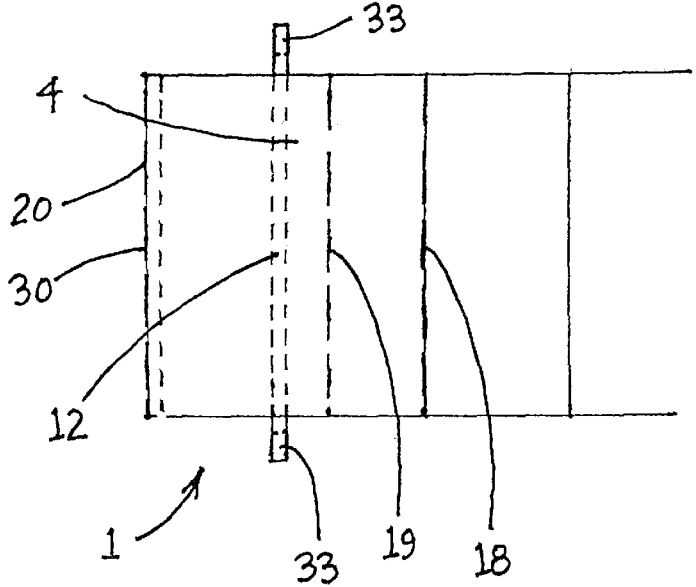
FIG. 3B is a top view of the portion of the cable support apparatus shown in FIG. 3A.

As shown in FIGS. 3A and 3B, each bend member 15 includes a plate 50 and a main body 51. The integral plate 50 is connected to the top surface 8 of the shelf member 3 via a plurality of fasteners (not shown). The intersection between the main body 51 of the bend member 15 and the top surface 8 of the shelf member 3 defines a line of intersection 18 which lies inboard along the shelf member 3 from the respective adjacent end 4,5. From the line of intersection 18, the bend member main body 51 tapers upward curvilinearly to a line of apogee 19. The line of apogee 19 is defined by highest portion of the bend member main body 51. The line of apogee 19 is disposed directly above the top surface 8 of the shelf member 3 and is disposed laterally between the line of intersection 18 and the respective adjacent end 4,5 of the shelf member 3. From the line of apogee 19, the bend member main body 51 extends curvilinearly downward over the upper edge 17 of the mounting bracket 12 to a distal edge 30 of the cable support apparatus 1, the slope of the bend member main body 51 at the distal edge 30 being substantially vertical. It should be noted that because the bend member main body 51 is generally cylindrical, both the highest portion of the bend member main body 51 and the distal edge 30 of the cable support apparatus 1 are line segments. It should be clear to one of ordinary skill in the art that the bend member main body 51 does not necessarily terminate at the point, defined as the line of verticality 20, where its slope becomes vertical, but may be extended past the line of verticality 20 either directly downward or extending inwardly toward the mounting bracket 12. It should also be clear that if the bend members have different geometric shapes, both the "line of apogee" and the "line of verticality" may actually have non-linear geometric shapes. The purpose of the above-described shape of the bend member 15 will be described below.

As shown in FIG. 1, each cable support apparatus 1 is installed in its respective equipment support system 22 such that the first side 6 of the shelf member 3 faces toward, and is mounted generally adjacent to, the rear of the frame apparatus 23, and the shelf member second side 7 faces toward, and is mounted generally adjacent to the rearmost vertical mounting rails 37 or the face of the equipment mounted therein. Although for clarity each cable support apparatus 1 is shown installed at an intermediate level of horizontal mounting rails 29, it should be clear that alternatively the cable support apparatus 1 may be installed at the topmost or bottommost level of horizontal mounting rails 29 or that the cable support apparatus 1 may be installed on horizontal mounting rails disposed in locations other than those shown. Further, it should be clear that one ore more additional cable support apparatus 1 may be installed in each equipment support apparatus 22.

The outboard side of each horizontal mounting rail 29 includes a second longitudinal grooved recess 43 having a T-shaped cross-section. The cable support apparatus 1 is mounted to its respective equipment support system 22 by inserting suitable fasteners 34, such as threaded bolts, into the second T-groove 43 of each horizontal mounting rail 29 such that the heads of the bolts reside in the T-groove 43 and the threaded ends protrude from the inboard side of the horizontal mounting rail 29. Once inserted, each fastener 34 may be adjusted longitudinally to a desired location along the length of the rail 29. Each fastener 34 is then positioned within one of the forked ends 33 of a respective mounting bracket 12 on the cable support apparatus 1. The lateral position of the cable support apparatus 1 relative to the external frame apparatus may then be adjusted by longitudinally sliding the fasteners 34, and hence the mounting brackets 12, along the T-grooves 43. Each of the fasteners 34 may then be secured by a hexagonal nut and washer combination.

Figure 4:
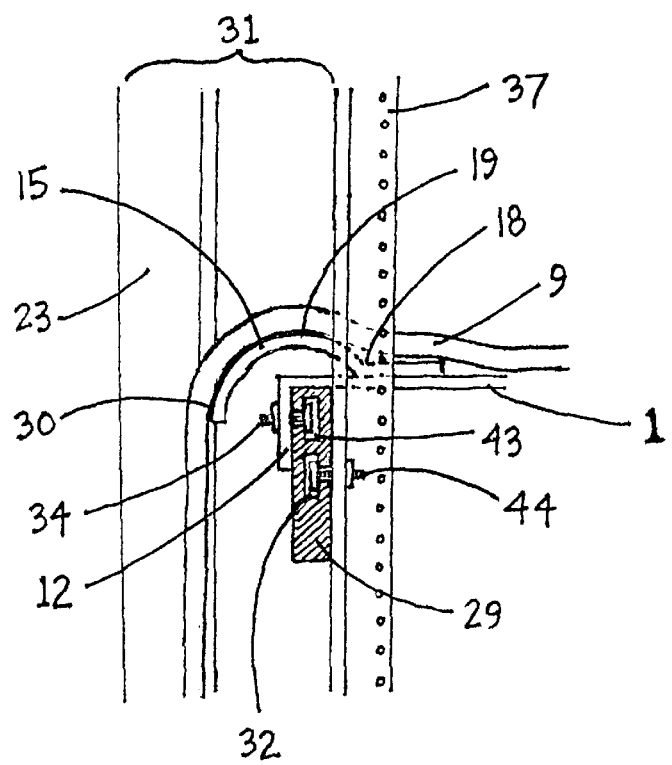
FIG. 4 is a cross-sectional view of a portion of the multi-frame equipment support system of FIG. 1 taken along line 4—4.

When the cable support apparatus 1 is mounted in the equipment support system 22 as shown in FIG. 4, the elevation of the respective lines of apogee 19 is sufficient to enable the respective bend members 15 to overhang the respective horizontal mounting rails 29. Further, each distal edge 30 of the cable support apparatus 1 and the interior surfaces of the external frame apparatus generally adjacent to that edge 30 define a vertical cable channel 31 through which one or more cable 9 may be directed in order to facilitate cable access to equipment mounted in the equipment support system 22 or to under-floor cabling systems. As shown in FIG. 1, a second cable support apparatus 1 is mounted in the second equipment support system 22 in like manner to that of the first. The two cable support apparatuses 1 are linearly arranged such that the first sides 6 of the cable support apparatuses 1 are generally linear with respect to one another, the second sides 7 are generally linear with respect to one another, and the top surfaces 8 are generally co-planar with each other. Thus, the modular cable support apparatuses 1 effectively form a continuous cable raceway extending from one distal edge 30 of the first cable support apparatus 1 to the opposite distal edge 30 of the second cable support apparatus 1 but where the two cable support apparatuses 1 are separated by one vertical cable channel 31 in the first equipment support system 22 and another vertical cable channel 31 in the second equipment support system 22.

Because each cable support apparatus 1 is modular and is mounted within the interior of its respective frame, each cable support apparatus 1 may be used in conjunction with adjacent equipment support structures no matter how wide they are. Also advantageously, the length of each cable support apparatus 1 is generally directly related to the distance between the outboard sides of the horizontal mounting rails 29. Although this distance is not precisely standardized, it is closely related to the distance between the rows of mounting apertures on the vertical mounting rails 37, and that distance is standardized. Thus, the cable support apparatus 1 of the present invention may be easily adapted to be mounted in equipment support systems 22 having a variety of frame widths but a relatively constant horizontal mounting rail separation. The variation in frame width is generally reflected in the dimensions of the vertical cable channels 31 rather than the horizontal mounting rail separation.

In use, equipment such as servers and the like may be installed in each equipment support system 22 by mounting the equipment to the vertical mounting rails 37 of the internal frame apparatus in a conventional manner. Each server or other piece of equipment may be attached to the vertical mounting rails 37 by inserting fasteners through selected apertures in the vertical mounting rails 37 and through corresponding apertures in the equipment, in a mounting chassis affixed to the equipment, or in a shelf or set of brackets attached to the vertical mounting rails 37 for the purpose of supporting the equipment. Because the cable support apparatus 1 is mounted adjacent to the rear of the frame apparatus 23, a significant amount of mounting space is still available for the equipment in front of the cable support apparatus 1.

Figure 5:
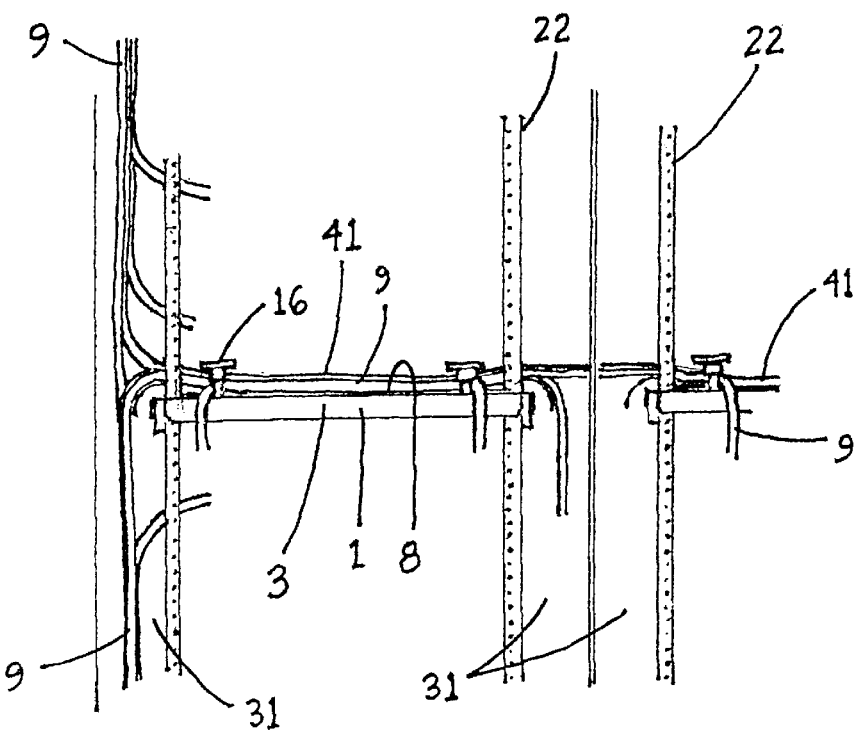
FIG. 5 is a cross-sectional view of the multi-frame equipment support system of FIG. 1 taken along line 5—5 and illustrating the routing of cables.

With the equipment in place, appropriate cables 9 may be routed into, out of and through the external and internal frame apparatuses of the equipment support system 22 as necessary for completion of the network installation. For example, as illustrated in FIG. 5, cables 9 may be routed down through the top of the external frame apparatus from overhead raceway directly to equipment mounted at or near the top of the frame interior, through the vertical cable channels 31 to equipment mounted at lower elevations in the frame interior, either above or below the cable support apparatus 1, or to the cable support apparatus 1 itself. Similarly, cables 9 may be routed up through the bottom of the external frame apparatus from under-floor cabling systems directly to equipment mounted at or near the bottom of the frame interior, through the vertical cable channels 31 to equipment mounted at higher elevations in the frame interior, either above or below the cable support apparatus 1, or to the cable support apparatus 1 itself.

As best illustrated in FIG. 5, cables 9 may be routed and supported on the cable support apparatus 1 as follows. A segment 41 of each of a plurality of cables 9 may be disposed horizontally along the top surface 8 of the cable support apparatus 1. The cable segment 41 is retained on the top surface 8 by the retention flange 13 and the spools 16. From the end of the shelf member, each cable 9 may be routed upward or downward into the vertical cable channel 31 or through the side of the external frame apparatus to an adjacent support structure such as a second cable support apparatus 1 in the arrangement shown in FIG. 1. By repeating the latter arrangement, a cable 9 may advantageously be extended through each of a long series of equipment support systems 22, with the cable support apparatus 1 in each equipment support system 22 supporting a single segment 41 of the cable 9.

It is well known in the art that routed cables must meet certain "bend" requirements in order to ensure proper operation of the cables. For example, any arcuate "bend" in a cable 9 may be required to have a certain minimum radius which is related to the diameter of the cable 9. When a cable 9 must be routed from the end of the shelf member 3 downward into the vertical cable channel 31, the cable 9 must be redirected or "bent" from a generally horizontal orientation to a generally vertical one. The bend members 15 of the present invention enable such cable redirection while preserving the minimum radius required for a particular cable. In particular, the bend members 15 of the present invention provide the minimum bend radii to meet Category 5 cabling requirements. Because the size of the bend member 15 is fixed, however, each bend member 15 projects into the vertical space otherwise available for vertical cabling, effectively limiting the size of the vertical cable channels 31, as shown in FIG. 4. Advantageously, the downward curve of each cable 9 is begun from the line of apogee 19, which is disposed at an elevation slightly above the shelf member top surface 8. Thus, traced outward from the shelf member 3, each bend member 15 first lifts the cable 9 from at least the line of intersection 18 to the line of apogee 19 so that the curvilinear descent of the cable 9 is begun at a point which is farther inward from the side of the frame than would otherwise be possible. It should be clear to one of ordinary skill in the art, however, that the line of apogee 19 could alternatively be disposed to be co-planar with the shelf member top surface 8 as long as the line of apogee 19 is sufficiently elevated above the respective mounting bracket upper edge 17 and the upper portions of the horizontal mounting rails 29 to enable the main body 51 of the bend member to extend over those surfaces. It should also be clear that different geometries may be employed for the bend members 15 such as otherwise reducing the slope of the bend member main body 51 between the line of intersection 18 and the line of apogee 19 or reducing the slope for of one or more portions of the main body 51 between line of apogee 19 and the line of verticality 20 as long as the minimum bend radius is at all times preserved.

Further assistance in meeting minimum bend requirements is provided by the spools 16. Equipment may be mounted in an equipment support system 22 in any of a wide variety of locations. Each piece of equipment may have one or more input/output connections which are usually located on the surface of the equipment. As described previously, the cable support apparatus 1 is mounted such that the second side 7 of the shelf member 3 is oriented to face the equipment, and more particularly, to face the input/output connections on the surface of the equipment. In this position, the forward side of the support rail 14 is approximately co-planar with the rearward side of the vertical mounting rails 37 or the surface of the equipment. Thus, in order to reach a particular piece of equipment, a cable 9 may be routed onto a portion of the top surface 8 of the shelf member 3, around one of the spools 16 and then to or from the equipment. The cylindrical lateral surfaces of the spools 16 help ensure that a cable 9 wrapped at least part way around the spool 16 is not bent by more than the radius of the spool 16. Such a cable 9 may then be directed to the appropriate input/output connections on the equipment.

The ventilation openings 11 extend through the top and bottom surfaces 8,10 of the shelf member 3 and enable air to pass vertically through the shelf member 3 of the cable support apparatus 1. Thus, heated air from the equipment may be more readily directed through and out of the frame interior.

It will therefore be readily understood by those persons skilled in the art that the present invention is susceptible of broad utility and application. Many embodiments and adaptations of the present invention other than those herein described, as well as many variations, modifications and equivalent arrangements, will be apparent from or reasonably suggested by the present invention and the foregoing description thereof, without departing from the substance or scope of the present invention. Accordingly, while the present invention has been described herein in detail in relation to its preferred embodiments, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the claims appended hereto and the equivalents thereof.

What is claimed is:

1. A cable support apparatus for supporting cables in an equipment support system having a frame apparatus, the cable support apparatus comprising:
    a shelf member having distal ends, first and second opposing sides, a generally planar top surface for supporting a cable, a bottom surface and a plurality of ventilation openings extending vertically through the top and bottom surfaces;
    at least one mounting bracket extending orthogonally from each distal end of the shelf member for mounting the cable support apparatus to the frame apparatus;
    a retention flange extending generally vertically from the top surface of the shelf member longitudinally along the first side of the shelf member for retaining cables on the top surface of the shelf member;
    a support rail extending generally vertically from the bottom surface of the shelf member longitudinally along the second side of the shelf member for structurally reinforcing the shelf member;
    a bend member extending away from at least one distal end of the planar shelf member; and
    at least one spool extending generally vertically from the top surface of the shelf member.

2. A cable support apparatus for supporting cables in an equipment support system, the cable support apparatus comprising:
    a planar shelf member having distal ends, a top surface for supporting a cable and a bottom surface;
    at least one mounting bracket extending orthogonally from each distal end of the shelf member for mounting the cable support apparatus to the frame apparatus, wherein each mounting bracket has an upper edge; and
    a bend member extending over the upper edge of one of the mounting brackets at one distal end of the shelf member, wherein the bend member intersects the top surface of the shelf member along a line of intersection disposed substantially inward from the distal end of the shelf member, wherein the bend member is upwardly tapered from the line of intersection to a line of apogee disposed above the top surface of the shelf member and inward from the distal end of the shelf member, and wherein the bend member is generally downwardly curved from the line of apogee over the upper edge of the mounting bracket to a line of verticality, the line of verticality being defined as the line at which the slope of the bend member is substantially vertical.

3. The cable support apparatus of claim 2 wherein the mounting brackets extend orthogonally downward from the bottom surface of the shelf member.

4. The cable support apparatus of claim 2 wherein the curvature of the bend member is substantially uniform from the line of apogee to the line of verticality.

5. The cable support apparatus of claim 2 wherein a radius is defined at each point along the bend member by the curvature of the bend member at each respective point, and wherein each such defined radius of curvature is at least as great as a predefined minimum radius of curvature.

6. The cable support apparatus of claim 5 wherein the predefined minimum radius of curvature corresponds to a minimum radius of cable curvature required to ensure reliable operation of the cable.

7. The cable support apparatus of claim 2 further comprising at least one spool extending generally vertically from the top surface of the shelf member.

8. An equipment support system comprising:
   a frame apparatus, the frame apparatus including a plurality of horizontal frame members and a plurality of vertical frame members, wherein each frame member has interior and exterior surfaces, and wherein the external surfaces of the frame members collectively define a frame periphery;
   two horizontal mounting rails connected to the vertical frame members of the frame apparatus;
   a cable support apparatus including a shelf member and two mounting brackets extending downwardly from distal ends of the shelf member, wherein the mounting brackets are mounted to respective horizontal mounting rails, wherein the cable support apparatus has two distal edges, and wherein the cable support apparatus is disposed wholly within the frame periphery; and
   at least one vertical cable channel for routing cables vertically within the periphery of the frame, the vertical cable channel being defined as the vertical space formed between one of the distal edges of the cable support apparatus and the interior surfaces of the vertical frame members.

9. The equipment support system of claim 8 wherein the shelf is horizontally adjustable along the horizontal mounting rails.

10. The equipment support system of claim 9 wherein each horizontal mounting rail includes a T-groove, wherein each mounting bracket includes a pair of forked ends, and wherein a respective fastener may be inserted through each forked end and into the T-groove in a horizontal mounting rail.

11. The equipment support system of claim 9 wherein the cable support apparatus further includes a curvilinear bend member extending downward over one of the mounting brackets.

12. The equipment support system of claim 8 further comprising at least one cable lying longitudinally along the cable support apparatus and extending laterally from the frame periphery at a point generally adjacent to a distal edge of the cable support apparatus.

13. The equipment support system of claim 8 further comprising at least one cable lying longitudinally along the cable support apparatus.

14. A multi-frame equipment support system comprising:
   a first frame apparatus, the first frame apparatus including a plurality of horizontal frame members and a plurality of vertical frame members, wherein each frame member has interior and exterior surfaces, and wherein the external surfaces of the frame members collectively define a first frame periphery;
   a second frame apparatus disposed substantially adjacent to the first frame apparatus, the second frame apparatus including a plurality of horizontal frame members and a plurality of vertical frame members, wherein each frame member has interior and exterior surfaces, and wherein the external surfaces of the frame members collectively define a second frame periphery;
   a first elongated cable support apparatus having first and second distal ends mounted entirely within the first frame periphery at right angles to the vertical frame members of the first frame apparatus at a first predetermined height, wherein the first elongated cable support apparatus extends toward the second frame apparatus and wherein the second distal end is disposed generally adjacent to the second frame apparatus; and
   a second elongated cable support apparatus having first and second distal ends mounted entirely within the second frame periphery at right angles to the vertical frame members of the second frame apparatus at a second predetermined height, wherein the second predetermined height is substantially the same as the first predetermined height, wherein the second elongated cable support apparatus extends toward the first frame apparatus and wherein the first distal end of the second elongated cable support apparatus is disposed generally adjacent to the first frame apparatus and is aligned with the second distal end of the first elongated cable support apparatus;
   whereby the first and second elongated cable support apparatuses together form a modular cable support apparatus for supporting at least one cable from the first frame apparatus to the second frame apparatus.

15. The multi-frame equipment support system of claim 14, further comprising a first pair of horizontal mounting rails connected to the vertical frame members of the first frame apparatus wherein the first elongated cable support apparatus is mounted to the first horizontal mounting rails.

16. The multi-frame equipment support system of claim 15, wherein the first elongated cable support apparatus includes a first shelf member and two mounting brackets extending orthogonally from ends of the first shelf member and wherein the mounting brackets are mounted to respective first horizontal mounting rails.

17. The multi-frame equipment support system of claim 14, further comprising at least one vertical cable channel for routing cables vertically within the first frame periphery, the vertical cable channel being defined as the vertical space formed between one of the distal ends of the first elongated cable support apparatus and the interior surfaces of the vertical frame members of the first frame apparatus.

18. The multi-frame equipment support system of claim 17, wherein the vertical cable channel is formed between the second distal end of the first elongated cable support apparatus and the interior surfaces of the vertical frame members proximate to the second frame apparatus.

19. The multi-frame equipment support system of claim 18, wherein the vertical cable channel is a first vertical cable channel, the multi-frame equipment support system further comprising at least a second vertical cable channel for routing cables vertically within the second frame periphery, the second vertical cable channel being defined as the vertical space formed between the first distal end of the second elongated cable support apparatus and the interior surfaces of the vertical frame members of the second frame apparatus.

20. The multi-frame equipment support system of claim 14, further comprising at least one cable lying longitudinally along the first and second cable support apparatuses.

21. A method for supporting a cable in an equipment support system having a frame apparatus which defines a frame interior, the method comprising:

(a) mounting a cable support apparatus having opposite ends wholly within the interior of the frame at a first predetermined height;

(b) supporting a first cable segment of a cable outside the periphery of the frame at a second predetermined height, the second predetermined height being substantially equal to the first predetermined height;

(c) directing the cable from outside the interior of the frame at the second predetermined height into the interior of the frame; and (d) supporting a second cable segment of the cable on the cable support apparatus.

22. The method of claim 21, further comprising the step of mounting a pair of horizontal mounting rails to the frame apparatus, and wherein the step of mounting the cable support apparatus includes mounting the cable support apparatus to the horizontal mounting rails.

23. A multi-frame equipment support system comprising:

a first frame apparatus, the first frame apparatus defining a first frame periphery and including at least two horizontal mounting rails, wherein the lateral sides of the first frame apparatus define a first cross-sectional area;

a second frame apparatus, the second frame apparatus defining a second frame periphery and including at least two horizontal mounting rails;

a first elongated cable support apparatus mounted entirely within the first frame periphery on the first horizontal mounting rails, the lateral edges of the first cable support apparatus defining a second cross-sectional area, wherein the second cross-sectional area is less than half as large as the first cross-sectional area; and a second elongated cable support apparatus mounted entirely within the second frame periphery on the second horizontal mounting rails, wherein the first and second cable support apparatuses are disposed at substantially similar heights and wherein one end of the first cable support apparatus is disposed generally adjacent a portion of the second cable support apparatus.

24. The multi-frame equipment support system of claim 23, further comprising at least one cable lying longitudinally along the first and second cable support apparatuses.

25. The multi-frame equipment support system of claim 24, wherein the lateral sides of the second frame apparatus define a third cross-sectional area, wherein the lateral edges of the second cable support apparatus define a fourth cross-sectional area, and wherein the fourth cross-sectional area is less than half as large as the second cross-sectional area.

26. The multi-frame equipment support system of claim 24, wherein at least one upwardly-extending member is disposed along each of at least two sides of the first cable support apparatus to retain the cable thereon.

27. The multi-frame equipment support system of claim 24, wherein the first cable support apparatus includes at least two mounting brackets, the mounting brackets being mounted to respective first horizontal mounting rails.

* * * * *